United States Patent [19]

Maeda et al.

[11] Patent Number: 5,288,326
[45] Date of Patent: Feb. 22, 1994

[54] APPARATUS FOR CONTINUOUS GROWTH OF SIC SINGLE CRYSTAL FROM SIC SYNTHESIZED IN A VAPOR PHASE WITHOUT USING GRAPHITE CRUCIBLE

[75] Inventors: Yasuhiro Maeda; Seiichi Taniguchi; Momoya Fukuda, all of Tokyo, Japan

[73] Assignee: Nisshin Steel Co., Ltd., Tokyo, Japan

[21] Appl. No.: 8,312

[22] Filed: Jan. 25, 1993

[30] Foreign Application Priority Data

Jan. 28, 1992 [JP] Japan .................................. 4-037208

[51] Int. Cl.$^5$ ............................................ C23C 16/00
[52] U.S. Cl. ................................. 118/719; 118/724; 118/725; 118/730
[58] Field of Search ................ 118/719, 724, 725, 730

[56] References Cited

U.S. PATENT DOCUMENTS

| | | | |
|---|---|---|---|
| 5,074,954 | 12/1991 | Nishizawa | 118/719 |
| 5,149,375 | 9/1992 | Matsuyama | 118/719 |
| 5,160,397 | 11/1992 | Doki | 118/719 |

*Primary Examiner*—Richard Bueker
*Attorney, Agent, or Firm*—Nikaido, Marmelstein, Murray & Oram

[57] ABSTRACT

A chamber (10) is divided into a reaction zone (20) and a sublimation zone (30). A gaseous mixture (41) is supplied through a conduit (21) into the reaction zone (20) and heated by a heater (27). The components in the gaseous mixture (41) are reaxcted with each other to synthesize solid-phase SiC (42). The solid-phase SiC (42) is heated and evaporated by a heater (35), and condensed as a single crystal (43) on a seed crystal attached to a mount base (37). The mount base (37) is rotated and lowered in response to the growth of the SiC single crystal (43) by a rotary shaft (38). Since the SiC single crystal (43) grows from SiC synthesized by the vapor-phase reaction, the obtained product is of very high purity without the substantial inclusion of impurities. In addition, a single crystal having a large diameter or length can be obtained without any restrictions originated in a crucible.

3 Claims, 1 Drawing Sheet

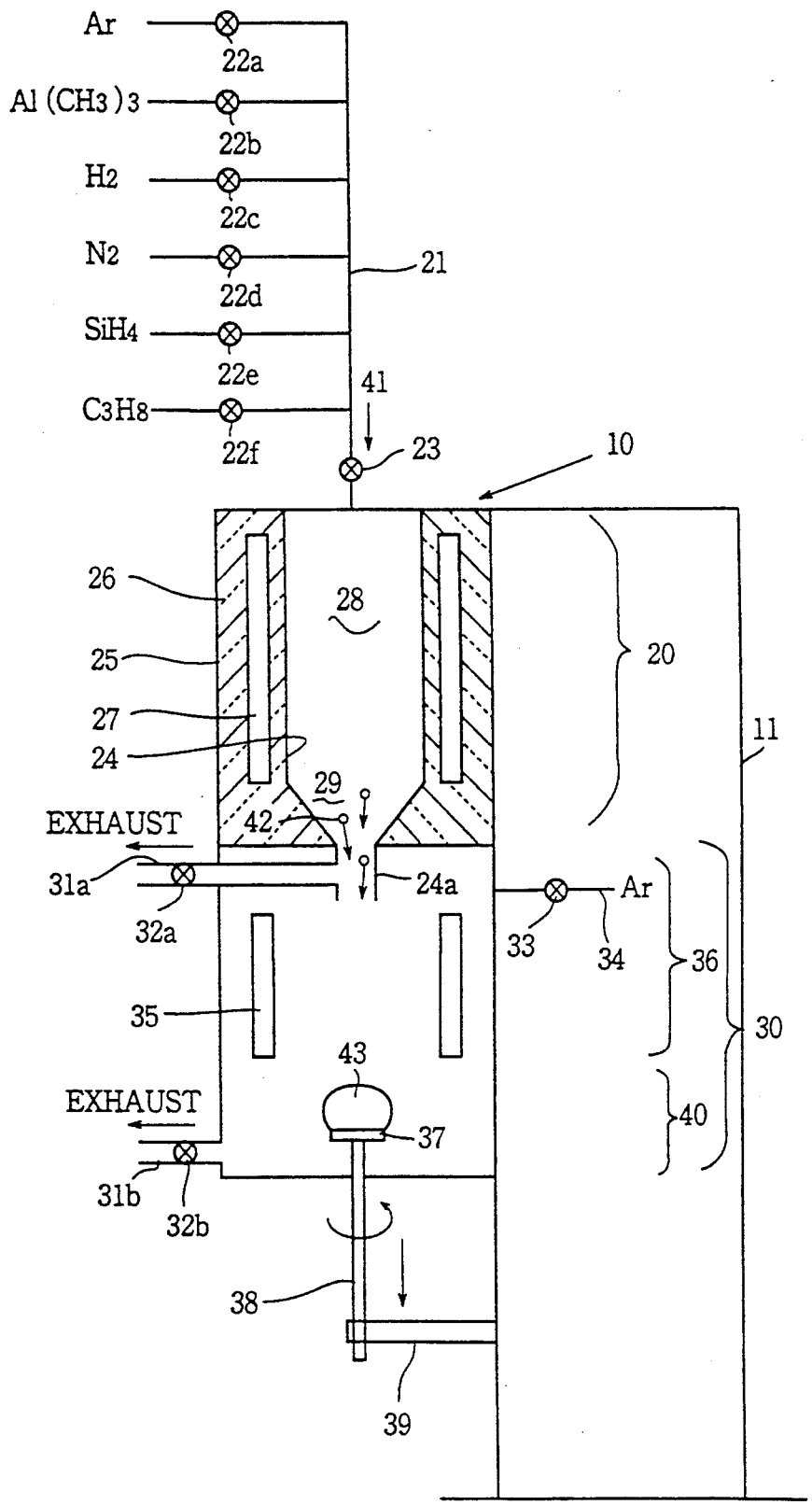

APPARATUS FOR CONTINUOUS GROWTH OF SIC SINGLE CRYSTAL FROM SIC SYNTHESIZED IN A VAPOR PHASE WITHOUT USING GRAPHITE CRUCIBLE

BACKGROUND OF THE INVENTION

The present invention relates to an apparatus for producing a high-purity SiC single crystal by the continuous sublimation and condensation of SiC prepared by vapor-phase synthesis. The apparatus is especially suitable for manufacturing a long and large-sized single crystal.

SiC single crystals which have been produced by the sublimation process are useful as functional materials, e.g. semiconductor devices, in various industrial fields.

In a method belonging to the sublimation process, a powder SiC material is received in a graphite crucible having covers, a seed crystal is attached to the cover plate at a position facing to the powder SiC material, which is heated at a temperature of 2000°-2500° C. The heated material is evaporated from the crucible and condensed on the surface of the seed crystal. The condensed SiC grows to a single crystal having a crystalline orientation aligned to that of the seed crystal.

In another method, a seed crystal is attached to the bottom of a graphite crucible, a perforated graphite hollow cylinder is located in the crucible, a cavity between the inner surface of the crucible and the hollow cylinder is filled with a powder SiC material, and the powder material is heated at a high temperature. The heated powder material is evaporated, let permeate through the holes formed in the hollow cylinder, and condensed on the surface of the seed crystal at the bottom of the crucible.

The crucible to be used in these methods is made of high-purity graphite to inhibit the contamination of an obtained SiC crystal with inclusions. Even when graphite material of highest purity available on the market is used for the crucible, it contains impurities in an amount of approximately 5 ppm. The impurities are evaporated from the wall of the crucible during high-temperature heating, and mixed in a growing SiC crystal. The impurities included in the obtained single crystal causes various problems such as the deterioration of function and malfunction, when the single crystal is used as an active material such as a semiconductor device.

It is postulated that the impurities in the crucible material are introduced into the single crystal according to the mechanism of: When the powder SiC material is evaporated in the crucible, the sublimation product, i.e. SiC gas, does not always have a stoichiometric composition, but contains Si, $Si_2$, C, $SiC_2$, $Si_2C$, etc. in a mixed state. These components are reacted with each other to form SiC gas, and consumed for the growth of the SiC single crystal. In addition, SiC is also produced by the reaction of the gaseous components such as Si, $Si_2$, $SiC_2$ and $Si_2C$ with C in the wall of the crucible. During the reaction with the crucible, the impurity elements in the crucible are evaporated at the same time and introduced into the growing single crystal.

The graphite crucible itself is consumed with the evaporation of C, so that the crucible changes its structure and the thickness of its wall. The changes in the structure and the wall thickness exhibits influences on the temperature gradient along the longitudinal direction of the crucible. Consequently, conditions for crystal growth fluctuate, so that an obtained single crystal has poor homogeneity and lower reliability in quality.

In the sublimation process using a graphite crucible, there are restrictions on the size of a usable crucible and the volume of a powder SiC material capable of being charged in the crucible. Due to the restrictions in a conventional method, it is practically impossible to produce a SiC single crystal having a diameter above approximately 30 mm or a length of several tens millimeter.

On the other hand, a single crystal larger in both diameter and length is required for enhancing productivity in the processing line of semiconductor devices. A SiC single crystal produced in the conventional process does not have a size sufficient to meet the requirement. In this regard, the production of SiC single crystals does not come onto the practically full-scale stage.

SUMMARY OF THE INVENTION

An object of the present invention is to produce high-purity SiC single crystals without using a graphite crucible which would cause various problems and restrictions.

Another object of the present invention is to enhance the degree of freedom on the diameter and length of an objective SiC single crystal product by the growth of a single crystal from SiC synthesized from a gaseous mixture.

An apparatus for the growth of SiC single crystals according to the present invention comprises a vacuum chamber divided into a reaction zone and a sublimation growth zone. In the reaction zone, solid-phase SiC is synthesized from a gaseous mixture introduced into the reaction zone. The solid-phase SiC is supplied from the reaction zone to the sublimation zone. In the sublimation zone, the supplied SiC is evaporated and let grow into a single crystal on the surface of a seed crystal.

The crystal growth is done without using a graphite crucible, so that high-purity SiC single crystals can be produced with the high degree of freedom on both of diameter and length, without any problems on production or products originated in the crucible. The obtained single crystal has excellent reliability on quality. The purity of the obtained single crystal is very high, since the solid-phase SiC synthesized by the vapour-phase reaction grows up into a single crystal having less opportunity of including impurities.

The other objects and features of the present invention will be understood from the following description with reference to the drawings attached.

BRIEF DESCRIPTION OF THE DRAWINGS

The single Figure is a schematic illustrating an apparatus for SiC crystal growth according to the present invention.

DETAILED DESCRIPTION OF THE PREFERRED EMBODIMENT

An apparatus for SiC crystal growth according to the present invention has a chamber (10) divided into a reaction zone (20) and a sublimation zone (30). The chamber (10) is supported by a frame (11) equipped with a control panel for various operations.

A conduit (21) is opened to the reaction zone (20), to supply a silane gas, a hydrocarbon gas, a doping gas and a carrier gas, respectively, necessary for the production of SiC. Each gas is let flow from a gas source to the conduit (21), and its flow amount is controlled by a flow regulating valves (22a)–(22f), respectively, to prepare a gaseous mixture (41) having a predetermined composition. A pressure regulating valve (23) is provided at a position near the reaction zone (20), to control the flow amount of the gaseous mixture (41) to be introduced into the reaction zone (20). Hereby, the interior of the reaction zone (20) is maintained at a predetermined gaseous pressure.

The reaction zone (20) has a reactor tube (24). The cross-section of the reactor tube (24) is varied from a large-diameter section to a small-diameter section along in the direction of flow of the gaseous mixture (41). A heat insulating member (26) is provided between the reactor tube (24) and an outer wall (25), and a heater (27) is located outside the reactor tube (24). An inner space surrounded by the large-diameter part of the reactor tube (24) serves as a vapor-phase reacting zone (28) for synthesizing SiC. SiC synthesized by the vapor-phase reaction flows downward by gravity through a passage (29) surrounded by the small-diameter part of the reactor tube (24).

The reactor tube (24) has a projecting part (24a) inserted into the sublimation zone (30). An exhaust pipe (31a) is opened to the interior of the projecting part (24a). Another exhaust pipe (31b) is opened to the lower part of the sublimation zone (30). Pressure regulating valves (32a) and (32b) are provided in the exhaust pipes (31a) and (31b), respectively. A supply conduit (34) equipped with a flow regulating valve (33) is opened to the interior of the sublimation zone (30), to introduce an inert gas such as Ar into the sublimation zone (30).

After the chamber (10) is evacuated, the gaseous mixture (41) having a predetermined composition is supplied through the conduit (21) into the chamber (10) while controlling the pressure regulating valves (32a), (32b), the flow regulating valve (33), etc.. Hereby, each of the reaction zone (20) and the sublimation zone (30) is maintained at a pressure suitable for the synthesis and sublimation of SiC and for the growth of a SiC single crystal. Unreacted gaseous components, e.g. hydrogen and hydrocarbon, from the gaseous mixture (41) supplied to the chamber (10) are discharged through the exhaust pipes (31a), (31b) to the outside.

The sublimation zone (30) has a heater (35) for heating the interior with a predetermined temperature gradient. Solid-phase SiC (42) flows past the projecting part (24a) of the reactor tube (24), which part (24a) protrudes into the sublimation zone (30), is heated by the heater (35) and evaporated. This part of the sublimation zone (30) serves as a sublimator part (36).

A crystal growth zone (40) is provided at the lower part of the sublimation zone (30). In the crystal growth zone (40), there is a mount base (37) for mounting a single crystal thereon. The mount base (37) is supported with a rotary shaft (38) passing through the bottom wall of the chamber (10). The rotary shaft (38) is coupled with an elevator rod (39) extending horizontally from the frame (11). Thereby, the mount base (37) is installed in a state capable of rotating in the crystal growth zone (40) and withdrawing from the chamber (10). Both the rotation speed and the withdrawal speed of the mount base (37) are controlled by operating a control panel (not shown) provided at the frame (11).

The components in the gaseous mixture (41) introduced through the conduit (21) into the reaction zone (20) are reacted with each other in the vapor-phase reacting zone (28) to synthesize the solid-phase SiC (42). The synthesized SiC (42) flows down through the passage (29), flows out past the projecting part (24a) of the reactor tube (24) and is heated by the heater (35). The heated SiC (42) is evaporated to SiC gas at the sublimator part (36). The formed SiC gas is condensed on a seed crystal (not shown) attached to the mount base (37) in the crystal growth zone (40), under the condition that the environmental temperature is maintained with a predetermined gradient at a constant pressure. Thereby, a SiC single crystal (43) grows on the seed crystal. The rotation speed and the withdrawal speed of the mount base (37) are controlled in response to the growing speed of the SiC single crystal (43), so as to maintain the conditions for crystal growth constant.

The sublimator part (36) is preferably held at the same pressure as that of the crystal growth zone (40) wherein the mount base (37) is located. The pressure in the reaction zone (20) is maintained higher than that of the sublimation zone (30), so as to circulate the synthesized SiC (42) downwards. The temperature of the reaction zone (20) is maintained lower than the sublimation point of SiC, while the projecting part (24a) of the reactor tube (24) is heated at a temperature above the sublimation point of SiC by the heater (35). In addition, the environmental temperature in the sublimation zone (30) is preferably controlled in a manner such that the temperature falls from the sublimator part (36) to the crystal growth zone (40) at a rate of 50° C./cm or less, to facilitate the growth of the single crystal from the evaporated SiC gas.

EXAMPLE

At first, Ar gas was introduced through the conduit (21) and the supply conduit (34) into the chamber (10), to exchange the atmospheric gas in the chamber (10) with Ar gas. The interior of the chamber (10) was then evacuated to $10^{-2}$ torr.. The supply of Ar gas and the evacuation were alternatively repeated 5 times, to remove inclusions from the chamber (10). Thereafter, Ar gas was re-supplied to the chamber (10), and the interior of the chamber (10) was heated up to 2400° C. by the heaters (27), (35). The interior of the chamber (10) was re-evacuated to 1 torr. and subjected to 1-hour baking treatment.

After the interior of the chamber (10) was conditioned, the gaseous mixture (41) was introduced into the reaction zone (20) and the sublimation zone (30) both held under the conditions shown in Table 1. Said gaseous mixture (41) was one prepared by mixing silane ($SiH_4$) gas in a flow rate of 0.3 ml/min., propane ($C_3H_8$) gas in a flow rate of 0.1 ml/min., hydrogen ($H_2$) gas in a flow rate of 1 l/min. and nitrogen ($N_2$) gas in a flow rate of 0.01 ml/min.. At the same time, Ar gas in a flow rate of 1 l/min. was supplied through the supply conduit (34) into the sublimation zone (30). Hereon, the pressure in the reaction zone (20) was maintained higher than that in the sublimation zone (30).

TABLE 1

| TEMPERATURE AND PRESSURE AT EACH ZONE | | |
|---|---|---|
| ZONE | TEMP. (°C.) | PRESSURE (TORR.) |
| REACTION ZONE (20) | 1200~1400 | 50~250 |
| SUBLIMATION ZONE (30) | 2000~2400 | 1~760 |
| TEMP. GRADIENT FROM SUBLIMATOR PART (36) TO CRYSTAL GROWTH ZONE (40) | | −15° C./min. |

In accompaniment with the growth of the SiC single crystal (43), the mount base (37) was lowered at a speed of 4 mm/hr. while being rotated at a rotation speed of 10 r.p.m.. The SiC single crystal (43) grew on the mount base (37). The obtained SiC single crystal (43) was of high quality without the inclusion of impurities. Since nitrogen was used as a doping gas, the SiC single crystal was type-n. The diameter of the SiC single crystal (43) was changed in response to the surface area of the mount base (37) with the high degree of freedom.

Nitrogen gas was used as a doping gas in the example above-mentioned. However, this is not the restriction on the scope of the present invention, but there may be used other gaseous composition, e.g. a gaseous material which does not contain any doping gas or a gaseous material containing a doping gas for producing a type-p single crystal. Fore instance, a type-p SiC single crystal was obtained by introducing $Al(CH_3)_3$ in a flow rate of 0.01 ml/min. instead of $N_2$.

According to the present invention as above-mentioned, the solid-phase SiC synthesized in the reaction zone is evaporated and then condensed so that the SiC single crystal grows on the seed crystal, attached to the mount base, as the starting point. Hereby, the growth of the SiC single crystal can be performed without using such a graphite crucible as those in a conventional method. Consequently, there do not occur problems originated in the graphite crucible, e.g. the migration of impurities from the crucible to the single crystal and the fluctuation in the conditions for crystal growth in accompaniment with the change in the thickness and structure of the crucible. Consequently, the high-purity SiC single crystal excellent in quality can be produced. In addition, there is not any restriction on the dimensions of the SiC single crystal to be produced according to the present invention. The single crystal large in diameter or length can be produced under the same conditions.

While the preferred embodiment and examples of the present invention has been shown and described, it is to be understood that these disclosures are for the purpose of illustration and that various changes and modifications may be made without deviating from the scope of the invention as set forth in the appended claims.

What is claimed is:

1. An apparatus for producing a SiC single crystal comprising:

a chamber divided into a reaction zone and a sublimation-crystal growth zone, conduit means for supplying gaseous reactants into said reaction zone, whereby providing a gaseous mixture in said reaction zone in which solid-phase SiC is synthesized from the gaseous mixture, means for delivering solid SiC from said reaction zone into a sublimation portion of said sublimation-crystal growth zone, means for subliming said solid SiC in said sublimization portion, a mount base means for mounting a seed crystal thereon disposed below said sublimation portion, in a crystal growth portion of said sublimation-crystal growth, a rotatable shaft in supporting relation to said mount base, and heater means for maintaining the interior of said sublimation-crystal growth zone with a predetermined gradient of temperature which decreases from said sublimation portion toward said seed crystal;

wherein said solid-phase SiC is synthesized from said gaseous reactants, is transferred into the sublimation portion and evaporated therein, and is condensed as a single crystal on the seed crystal in said crystal growth portion.

2. The apparatus according to claim 1, wherein said conduit means is connected to a silane gas source, a hydrocarbon gas source, and a carrier gas source.

3. The apparatus according to claim 1, including means to rotate said mount base, means to lower such base means, and means to control the speed of rotation of said shaft in response to the growth of the single crystal.

* * * * *